United States Patent [19]
Osaki et al.

[11] Patent Number: 5,650,916
[45] Date of Patent: Jul. 22, 1997

[54] IC CARD AND SOCKET CONNECTIONS

[75] Inventors: Katsuhiko Osaki; Yasunobu Toneaki, both of Shiga-ken, Japan

[73] Assignee: International Business Machines Corporation, Armonk, N.Y.

[21] Appl. No.: 619,956

[22] Filed: Mar. 20, 1996

[30] Foreign Application Priority Data

Mar. 23, 1995 [JP] Japan ................................ 7-064419

[51] Int. Cl.[6] ................................................ H05K 1/14
[52] U.S. Cl. .......................... 361/737; 361/785; 361/728; 361/752; 257/679
[58] Field of Search .................... 361/737, 741, 361/728, 787, 785, 842, 803, 752; 257/679, 730; 235/492

[56] References Cited

U.S. PATENT DOCUMENTS

| | | | |
|---|---|---|---|
| 5,387,816 | 2/1995 | Takahashi et al. | 257/723 |
| 5,472,351 | 12/1995 | Greco et al. | 439/353 |
| 5,477,418 | 12/1995 | MacGregor et al. | 361/737 |
| 5,548,484 | 8/1996 | Kantner | 361/737 |

*Primary Examiner*—Leo P. Picard
*Assistant Examiner*—Anthony Dinkins
*Attorney, Agent, or Firm*—Bernard D. Bogdon

[57] ABSTRACT

The invention provides for sharing a socket between a new-standard IC card provided with side electrodes on the sides thereof, to thereby allow the number of connections to be increased, and a current-standard IC card, and to prevent the side electrodes and the mating side electrodes of a socket from being rubbed against each other by a simple structure without any need for specific operation when an IC card is inserted or removed.

3 Claims, 5 Drawing Sheets

IC CARD AND SOCKET CONNECTIONS

BACKGROUND OF THE INVENTION

1. Field of the Invention

The present invention relates to an arrangement of connections between an IC card and a socket into which the card is inserted.

2. Description of Related Art

Computers are required to process more data at higher speeds, and accordingly, the number of connections between system units, for example, between an IC card and a socket into which the card is inserted needs to be increased.

An IC card is provided at the insertion end thereof with a connector consisting of a plurality of pin holes, into which electrode pins projected from a socket are fitted to make electrode connections. The Personal Computer Memory Card International Association (PCMCIA), an American standardization body, has standardized such IC cards.

Connector pin holes and socket electrode pins can be increased in numbers to increase the number of connections between an IC card and a socket; however, such a way causes the diameter of pins and the interval therebetween to be changed. Thus a computer main body must be equipped with two types of sockets to cover both current-standard IC cards (standardized by PCMCIA) and other IC cards (nonstandard IC cards).

OBJECTS OF THE INVENTION

Under these circumstances, it is an object of the present invention to provide an arrangement of connections between an IC card and a socket, an arrangement which allows the number of such connections to be increased and a socket to be shared between a new-standard IC card, enabling an increasing number of such connections, and a current-standard I(C) card and prevents side electrodes and mating side electrodes from being rubbed against each other by a simple structure with no need for specific operations to avoid damage due to rubbing.

SUMMARY OF THE INVENTION

To solve the above-described problems, an arrangement according to the present invention, the arrangement of connections between an IC card and a socket into which said IC card is inserted, one end first, comprises: said IC card includes front end electrodes at the insertion end thereof and side electrodes on the sides thereof parallel to the direction of insertion; the socket includes mating front end electrodes provided at the farthest end of an IC card insertion passage, which mating front end electrodes correspond to the front end electrodes, movable members provided in parallel with the sides of the IC card insertion passage, which movable members can move in the direction of IC card insertion passage width, mating side electrodes provided for the movable members so as to move together with the movable members, which mating side electrodes correspond to the side electrodes, and pushing means pushing the movable members toward the IC card insertion passage in the direction of IC card insertion passage width; convexes provided for the movable members, which convexes, when the IC card is inserted or removed, are pushed by the sides of the IC card, so that the movable members are placed in the outermost position thereof in the direction of IC card insertion passage width, thereby separating the side electrodes from the socket and the mating side electrodes from the IC card including the side electrodes; and concaves provided on the sides of the IC card, which concaves fit into the convexes at the position where the front end electrodes fit into the mating front end electrodes and thus allow the movable members to return to the original position thereof to bring the side electrodes into contact with the mating side electrodes.

An arrangement according to the present invention, the arrangement of connections between an IC card and a socket into which the IC card is inserted, one end first, comprises: the IC card includes at least side electrodes on the sides thereof in the direction of insertion or both the side electrodes and front end electrodes at the insertion end thereof; the socket includes mating front end electrodes provided at the farthest end of an IC card insertion passage, which mating front end electrodes correspond to the front end electrodes, movable members provided in parallel with the sides of the IC card insertion passage, which movable members can move in the direction of IC card insertion passage width, mating side electrodes provided for the movable members so as to move together with the movable members, which mating side electrodes correspond to the side electrodes, and pushing means pushing the movable members toward the IC card insertion passage in the direction of IC card insertion passage width; convexes provided for the movable members, which convexes, when the IC card is inserted or removed, are pushed by the sides of the IC card, so that the movable members are placed in the outermost position thereof in the direction of IC card insertion passage width, thereby separating the side electrodes from the socket and the mating side electrodes from the IC card including the side electrodes; and concaves provided on the sides of the IC card, which concaves, when the insertion of the IC card is completed, fit over the convexes, thereby allowing the movable members to return to the original position thereof to bring the side electrodes into contact with the mating side electrodes.

An IC card insertion socket according to the present invention comprises: an IC card insertion passage into which an IC card including at least side electrodes on the sides thereof or both the side electrodes and front end electrodes at one end is inserted, the one end first; mating front end electrodes provided at the farthest end of an IC card insertion passage, which mating front end electrodes correspond to the front end electrodes; movable members provided in parallel with the sides of the IC card insertion passage, which movable members can move in the direction of IC card insertion passage width; mating side electrodes provided for the movable members so as to move together with the movable members, which mating side electrodes correspond to the side electrodes; pushing means pushing the movable members toward the IC card insertion passage in the direction of IC card insertion passage width; and convexes provided for the movable members, which convexes, when the IC card is inserted or removed, are pushed by the sides of the IC card, so that the movable members are placed in the outermost position thereof in the direction of IC card insertion passage width, thereby separating the side electrodes from the socket and the mating side electrodes from the IC card, the convexes, when the insertion of the IC card is completed, fitting into concaves provided on the sides of the IC card and thus allowing the movable members to return to the original position thereof to bring the side electrodes into contact with the mating side electrodes.

DETAILED DESCRIPTION OF THE INVENTION

According to the above-described arrangements, when the IC card is inserted into the passage, the convexes of the movable members is pushed by the sides of an IC card and thus placed in the outermost position thereof in the direction of IC card passage width. The side electrodes of the IC card are not rubbed against the socket, nor are the mating side electrodes of the socket rubbed against the IC card, nor are the side electrodes and the mating side electrodes rubbed against each other when the IC card is inserted. When the insertion of an IC card with both front end electrodes and side electrodes is completed, that is, when the front end electrodes come into contact with the mating front end electrodes, the convexes fit into the concaves on the sides of the IC card, thereby allowing the movable members to return to their original position. Thus the movable members are placed in the innermost position thereof in the direction of IC card insertion passage width, so that the side electrodes and the mating side electrodes come into contact with each other.

When the IC card is removed, the convexes of the movable members are also pushed by the sides of the IC card, so that the movable members are placed in the outermost position thereof in the direction of IC card insertion passage width. As is the case with the insertion of the IC card, the side electrodes thereof are not rubbed against the socket, nor are the mating side electrodes of the socket rubbed against the IC card, nor are the side electrodes rubbed against the mating side electrodes when the IC card is removed.

In contrast to a currently standardized IC card (current-standard IC card), an IC card (new-standard IC card) according to the present invention, provided with side electrodes or both front end electrodes and side electrodes, allows the number of front end electrodes to be increased, the diameter of pins or the interval therebetween not being changed. A common socket can receive both a current-standard IC card and a new-standard IC card provided with electrodes and concaves on the sides thereof. When a current-standard IC card is inserted into or removed from the IC card insertion passage, the convexes of the movable plates are pushed by the sides of the current-standard IC card, so that the movable plates are placed in the outermost position thereof in the direction of IC card insertion passage width. As is the case with a new-standard IC card, mating side electrodes do not come into contact with a current-standard IC card when the current-standard IC card is inserted or removed. Since a current-standard card has on the sides thereof no equivalent to concaves, the movable plates are kept in the outermost position thereof in the direction of IC card insertion passage width when the front end electrodes come into contact with the mating front end electrodes, so that the insertion of the current-standard card is completed.

Thus a common socket can accommodate both a current-standard IC card with front end electrodes only and a new-standard IC card with at least side electrodes, providing a current-standard IC card with not only front end electrodes but side electrodes allows the number of connections with a socket to be increased, and moreover, an arrangement of the present invention enables socket space to be more reduced, compared with a conventional arrangement requiring different sockets, depending on whether a current-standard IC card or an IC card having an increased number of connections with a socket is used. In addition, when an IC card is inserted or removed, the side electrodes thereof and the mating side electrodes of a socket are prevented from being rubbed against each other (or the mating side electrodes of the socket are prevented from being rubbed against a current-standard IC card) to avoid mechanical damage due to rubbing. This rubbing prevention is performed by a simple structure including the concaves on the sides of an IC card and the convexes of movable members, with no need for any specific operation other than the insertion and removal of the IC card.

Referring now to FIGS. 1 to 7, an embodiment of an arrangement of electrode connections between an IC card and a socket, the arrangement according to the present invention, is described below.

Figure 1:
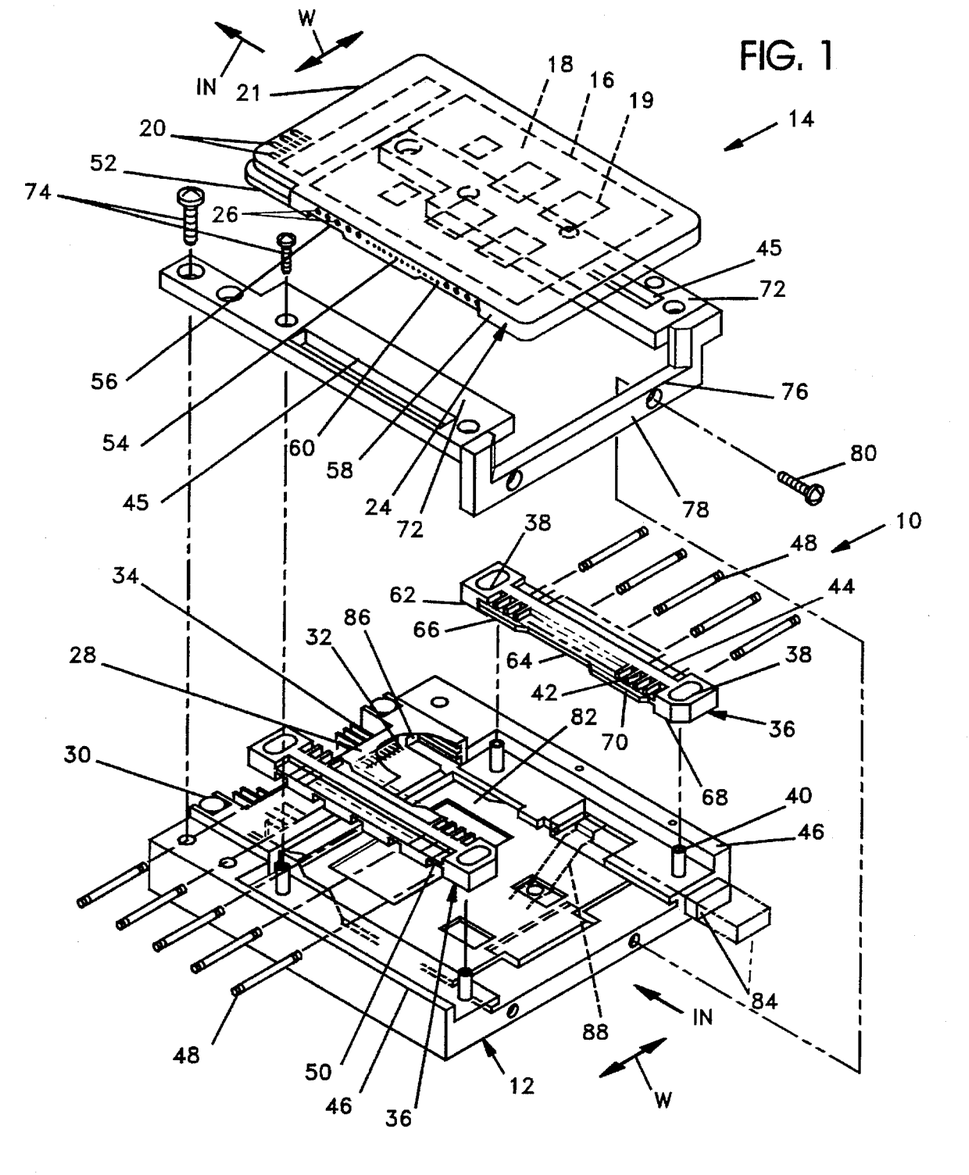
FIG. 1 is an exploded perspective view showing an arrangement of connections between an IC card and a socket in an embodiment of the present invention.
Figure 2:
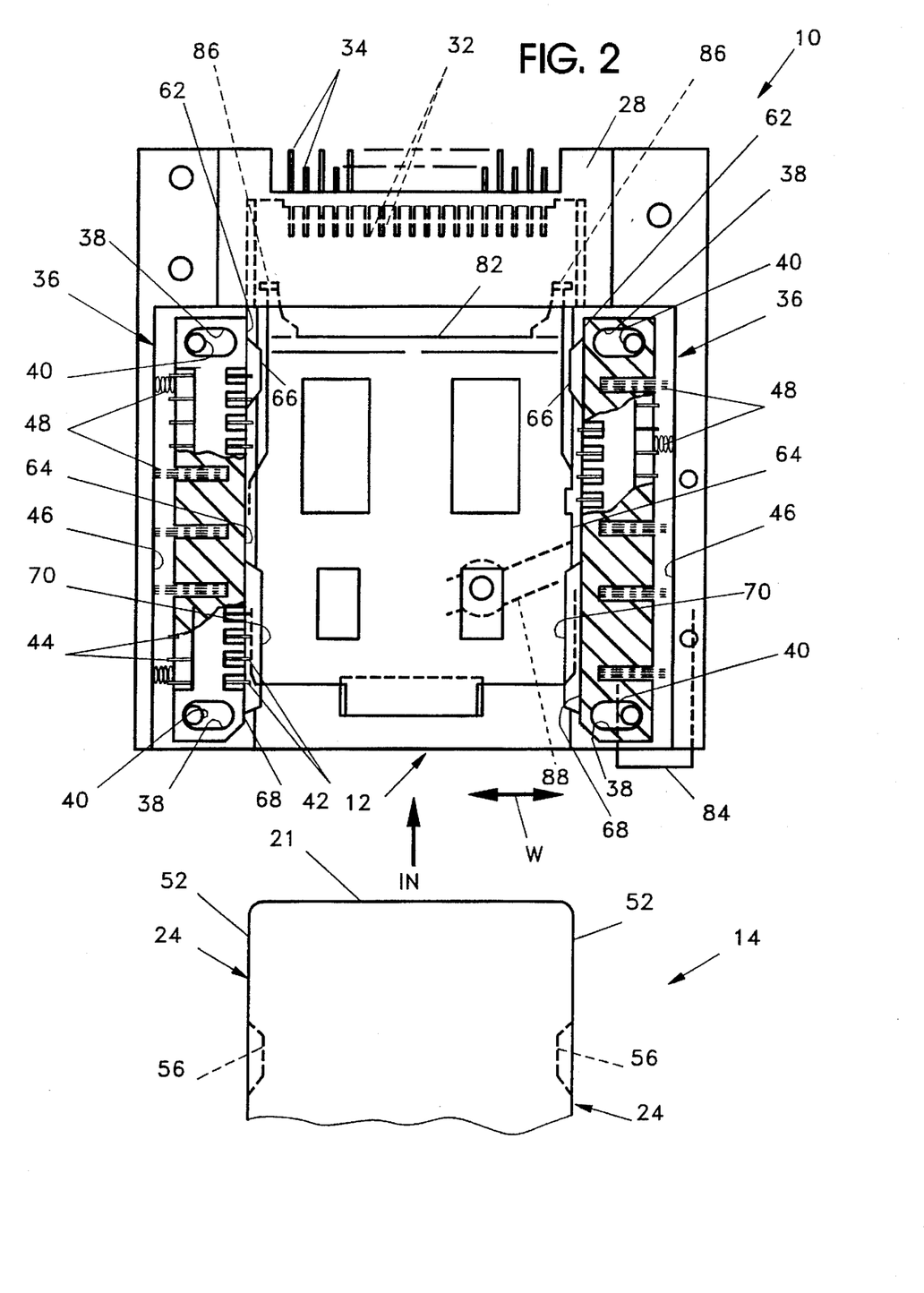
FIG. 2 is a top view showing the condition of the embodiment before an IC card is inserted.

As shown in FIG. 1, an IC card 14 is inserted over the top surface of a base 12 of a socket 10 for a personal computer (not shown) serving as a data processing unit, the base being rectangular (the direction of IC card insertion is indicated by an arrow IN). The IC card 14 is formed into a thin, rectangular plate by fitting a circuit board 18, on which ICs 19 are mounted, into a rectangular frame 16 and providing the frame with top and bottom surfaces. The front end of the IC card 14 as viewed in the direction of IC card insertion is a connector which has a plurality of front end electrodes 20, or pinhole electrodes, provided in the front end surface 21 of the IC card 14 in two rows in the direction of IC card width. A plurality of side electrodes 26 are provided on both sides 24 of the IC card 14 in one row in the direction of IC card insertion so as to be flush with the sides 24.

Using screws 30, a mating connector 28 corresponding to the above-described connector is fixed to the base 12 of the socket 10 at the farthest end of an IC card insertion passage. The mating connector 28 is formed into a tube, from the bottom end of which a plurality of mating front end electrodes 32, or pin electrodes, corresponding to the front end electrodes 20 are projected, and terminals 34 of an L shape, connected with the front end electrodes 32, are projected from the mating connector 28 in the direction of IC card insertion. Movable plates 36 are provided as movable members in parallel with both sides of the IC card insertion passage on the base 12. Guide holes 38 are formed in the vertical direction (direction of the thickness of the movable plates 36) through both longitudinal ends of the movable plates 36 of a rectangular shape. The guide holes 38 are elongated in the direction of IC card insertion passage width (indicated by an arrow W), and a guide projection 40 is provided on the base 12 for each of the guide holes 38. The guide projections 40, fitted into the guide holes 38, relatively moves along a longer side of the holes, thereby allowing the movable plate 36 to move in the direction of IC card insertion passage width. The guide projections 40 are movable so long as they do not rest against the ends of the guide holes 38.

A plurality of mating side electrodes 42, or spring pin connection type electrodes, corresponding to the side electrodes 26 are projected from the sides of the movable plates 36, which sides are faced with the IC card insertion passage, and terminals 44 connected with the mating side electrodes 42 are projected from the other sides of the movable plates 36.

The base 12 is formed with the sides thereof, which are along the IC card insertion passage, raised, and a plurality of coil springs 48 (pushing means) are placed between raised portions 46 and the movable plates 36, the coil springs 48 pushing the movable plates 36 toward the IC card insertion passage. Receiving concaves 50, accommodating ends of the coil springs 48, are formed in the movable plates 36.

With its front end, rear end, and middle portion being left entire, the IC card 14 is concaved between the front end and the middle portion and between the middle portion and the rear end along the lower edges of both sides 24 below the side electrodes 26 as if the IC card were notched; portions between the front end (first residual portion 52) and the middle portion (second residual portion 54) are referred to as first concaves 56, and those between the middle portion (second residual portion 54) and the rear end (third residual portion 58) are referred to as second concaves 60.

On the other hand, convexes are provided on the sides of the movable plates 36, which sides are faced with the IC card, below the mating side electrodes 42, the convexes corresponding to the concaves on the sides 24 of the IC card 14. The convexes are intermittently arranged in such a manner that portions of the movable plates 36, the portions corresponding to the farthest end, entrance end, and middle portions therebetween of the IC card insertion passage, are lacked; portions of the movable plates 36, the portions between the portions (first lacked portions 62) thereof corresponding to the farthest end of the IC card insertion passage and those (second lacked portions 64) thereof corresponding to the middle portions of the IC card insertion passage, are referred to as first convexes 66, and portions of the movable plates 36, the portions between the portions (second lacked portions 64) thereof corresponding to the middle portions of the IC card insertion passage and those (third lacked portions 68) thereof corresponding to the entrance end of the IC card insertion passage, are referred to as second convexes 70.

Figure 4:
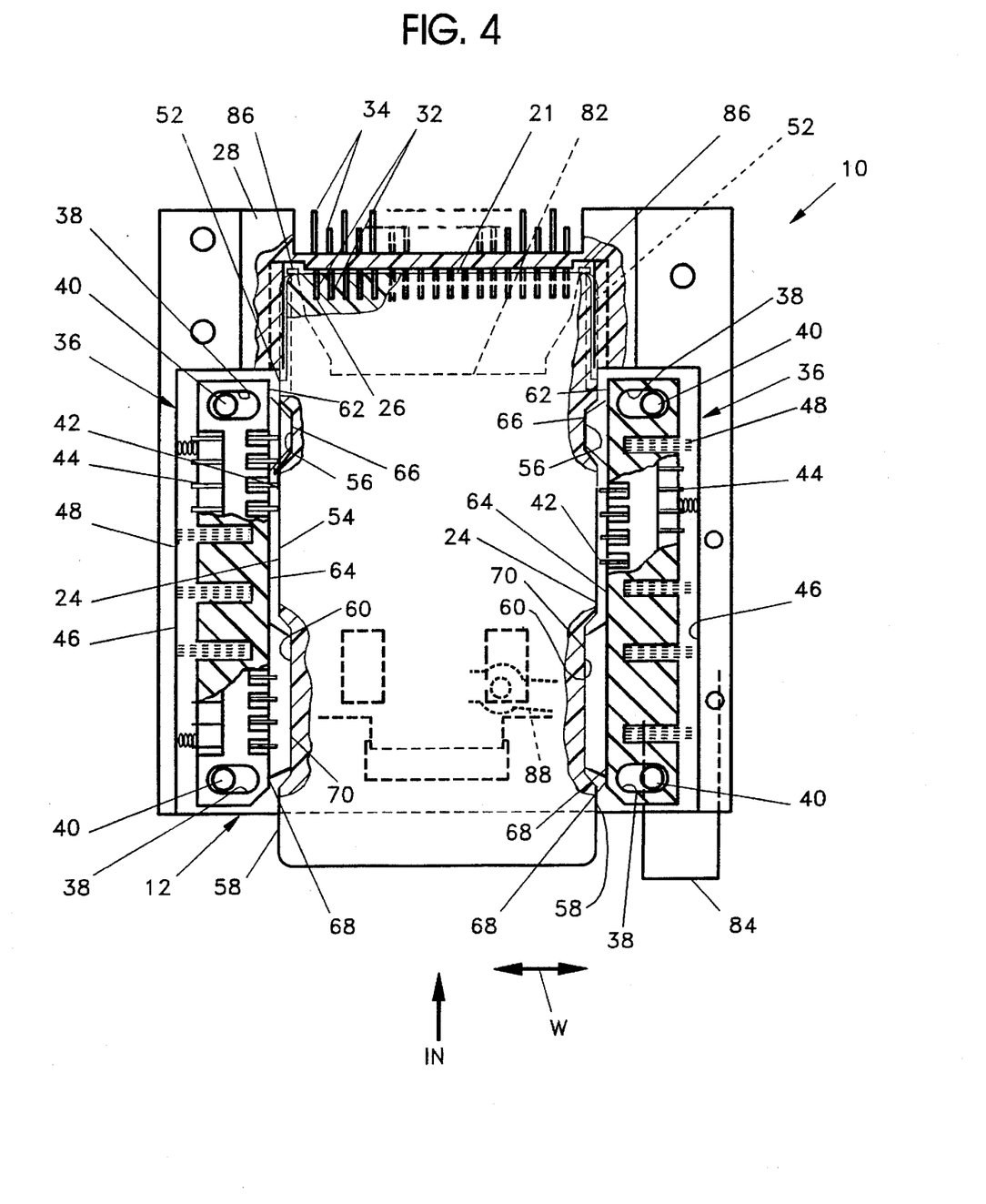
FIG. 4 is a view, equivalent to FIG. 2, showing the IC card already inserted.
Figure 6:
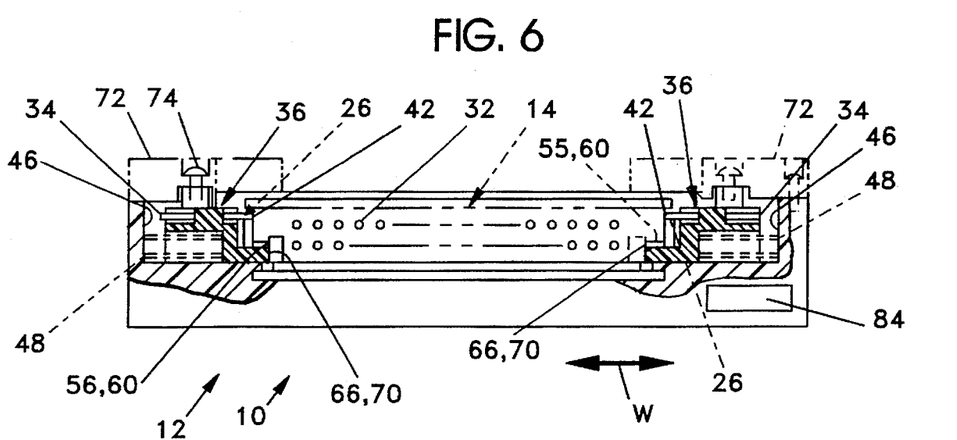
FIG. 6 is a view, equivalent to FIG. 5, showing the IC card already inserted.

The side electrodes 26 are formed in a row in portions of the IC card 14, corresponding to the first and second concaves 56 and 60, the mating side electrodes 42 are formed in a row in portions of the socket 10, corresponding to the first and second convexes 66 and 70, which are injected further into the IC card insertion passage than the mating side electrodes 42. The relative positional relationships between the first and second convexes 66 and 70 and the first and second concaves 56 and 60 are as follows: when the IC card 14 is inserted to connect the front end electrodes 20 with the mating front end electrodes 32, the first and second convexes 66 and 70 are fitted into the first and second concaves 56 and 60, respectively, as shown in FIGS. 4 and 6, so that the movable plates 36 are placed in their innermost position in the direction of IC card insertion passage width to correspondingly press the mating side electrodes 42 and the side electrodes 26 against each other.

Figure 3:
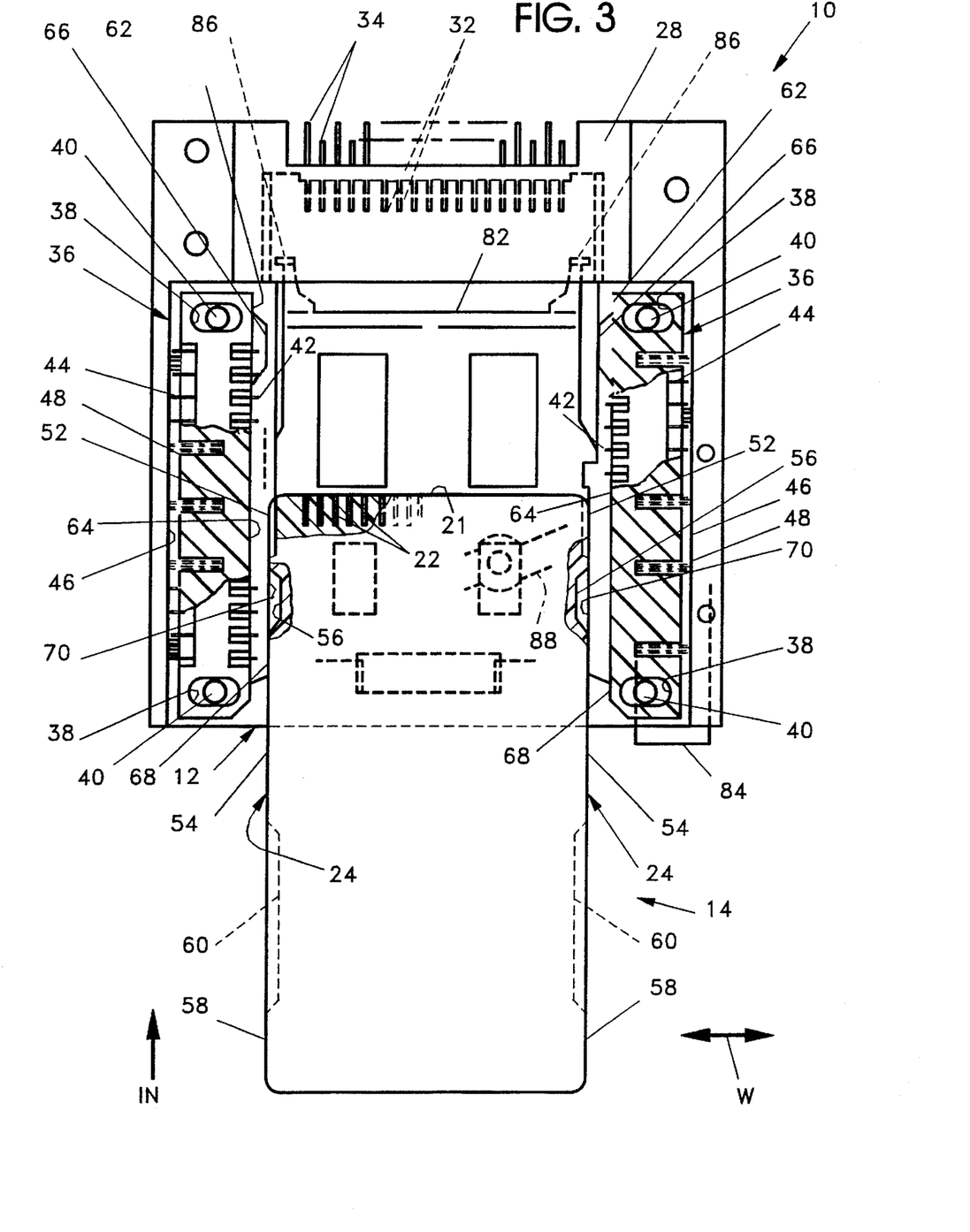
FIG. 3 is a view, equivalent to FIG. 2, showing the IC card in the process of insertion.
Figure 5:
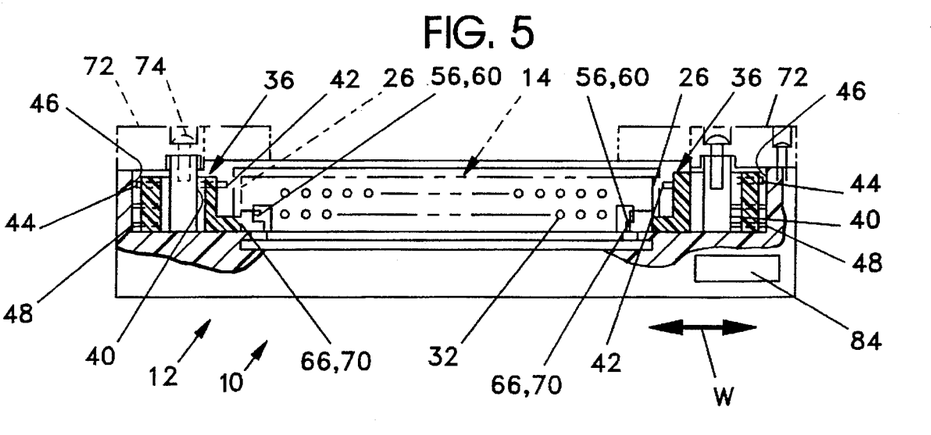
FIG. 5 is a view as seen in the direction of IC card insertion, showing the IC card in the process of insertion.

As shown in FIGS. 3 and 5, the first convexes 66 and the second convexes 70 cannot be fitted into the first concaves 56 and the second concaves 60, respectively, when the IC card is inserted or removed, and the first and second convexes 66 and 70, in contact with the sides 24 of the IC card 14 (the first, second, and third residual portions 52, 54, and 58), are pushed by the sides 24 of the IC card 14, and consequently, the movable plates 36 are placed in their outermost position in the direction of IC card insertion passage width, thereby separating the side electrodes 26 and the mating side electrodes 42 from the socket 10 and the IC card 14, respectively. When the insertion of the IC card 14 starts, the first residual portions 52 of the sides 24 of the IC card 14 pass the third lacked portions 68 of the movable plates 36 and rest against the second convexes 70, so that the first residual portions 52 push the second covexes 70 against pushing forces of the coil springs 48 to move the movable plates 36 outward in the direction of IC card insertion passage width. Until the first and second convexes 66 and 70 reach the positions where the first and second convexes fit into the first and second concaves 56 and 60, respectively, the sides 24 of the IC card 14 are in contact with the first and second convexes 66 and 70 at least any of the first, second, and third residual portions 52, 54, and 58, thereby allowing the movable plates 36 to be kept in their outermost position in the direction of IC card insertion passage width. Provisions are made so that the front end of the IC card 14 can be inserted into the tube of the mating connector 28 to properly position the front end electrodes 20 relative to the mating front end electrodes 32.

Both ends of the first and second convexes 66 and 70 are slanted relative to the direction of IC card insertion to help the first and second convexes 66 and 70 come out of the first and second concaves 56 and 60 when the IC card 14 is inserted or removed.

When an IC card 14 is inserted, first convexes 66 and second convexes 70 are pushed by the sides 24 (first residual portions 52, second residual portions 54, and third residual portions 58) of the IC card 14, so that movable plates 36 are placed in the outermost position thereof in the direction of IC card insertion passage width. The side electrodes 26 of the IC card 14 are not rubbed against the mating side electrodes 42 when the IC card is inserted. When front end electrodes 20 come into contact with mating front end electrodes 32, so that the insertion of the IC card 14 is completed, the first convexes 66 and the second convexes 70 fit into the first concaves 56 and the second concaves 60 on the sides 24 of the IC card 14, respectively, and thus the movable plates 36 are placed in the innermost position thereof in the direction of IC card insertion passage width to bring the side electrodes 26 into contact with the mating side electrodes 42.

With screws 74, cover plates 72 are secured to the raised portions 46 of the base 12 (some of the screws 74 are tightened to the top of the guide protrusions 40) so as to sandwich the movable plates 36 between the cover plates 72 and the base 12, and an entrance plate 78 is fastened with screws 80 to the IC card entrance end surface of the base 12 to form an IC card entrance 76. A long, rectangular hole 45, fitting over terminals 44 connected with the mating side electrodes 42, is provided in the cover plates 72.

An operation plate 82 is provided in the IC card insertion passage on the base 12, and an operation button 84 is projected from the IC card entrance end surface of the base 12 in the direction of IC card removal so that the button avoids the entrance plate 78. When the IC card is inserted, hooks 86 corresponding to the right and left corners at the front end surface 21 of the IC card 14, which hooks are formed on both sides at the front end of the operation plate 82, are pushed by the front end surface 21 of the IC card 14, thereby moving the operation plate 82 in the direction of IC card insertion so that the operation button 84 is pushed out from the position indicated by a solid line to that indicated by a broken line (see FIG. 1) via an interlocking plate 88, and conversely, depressing the operation button 84 causes the operation plate 82 to move in the direction opposite to that of IC card insertion to pull the IC card 14, using the hooks 86, thereby allowing to easily detach the mating front end electrodes 32 from the front end electrodes 20 (the first and second convexes 66 and 70 are released from the first and second concaves 56 and 60, respectively, so that the movable plates 36 are placed in their outermost position in the direction of IC card insertion passage width). Then the IC card 14 can be removed from the socket 10 by pulling the card.

According to the above-described arrangement, as shown in FIGS. 3 and 5, the first and second convexes 66 and 70 are pushed by the sides 24 (the first, second, and third residual portions 52, 54 and 58) of the IC card 14, so that the movable plates 36 are placed in their outermost position in the direction of IC card insertion passage width. When the IC card 14 is inserted, the side electrodes 26 of the IC card 14 are not rubbed against the socket 10, nor are the mating side electrodes 42 of the socket 10 rubbed against the IC card 10, nor are the side electrodes 26 rubbed against the mating side electrodes 42. When the front end electrodes 20 come into contact with the mating front end electrodes 32, so that the insertion of the IC card 14 is completed, the first and second convexes 66 and 70 fit into the first and second concaves 56 and 60 on the sides 24 of the IC card 14 as shown in FIGS. 4 and 6, so that pushing forces of the coil springs 48 allow the movable plates 36 to return to their original positions. The movable plates 36 are placed in their innermost position in the direction of IC card insertion passage width, and thus the side electrodes 26 come into contact with the mating side electrodes 42.

When the IC card 14 is removed, the first and second convexes 66 and 70 of the movable plates 36 are pushed by the sides 24 (the first, second, and third residual portions 52, 54, and 58) of the IC card 14, so that the movable plates 36 are placed in the outermost position thereof in the direction of IC card insertion passage width. As is the case with the insertion of the IC card 14, when the IC card is removed, the side electrodes 26 of the IC card 14 are not rubbed against the socket 14, nor are the mating side electrodes 42 of the socket 10 rubbed against the IC card 14, nor are the side electrodes 26 rubbed against the mating side electrodes 42.

Figure 7:
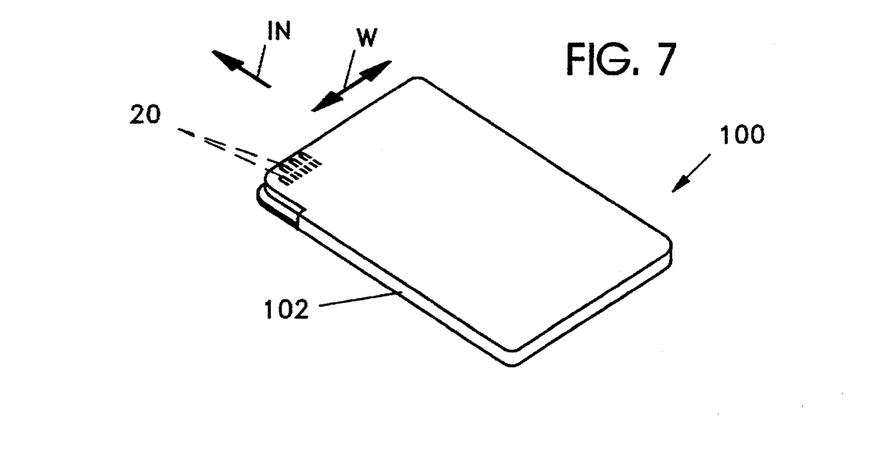
FIG. 7 is a perspective view showing a current-standard IC card.

The IC card 14 (new-standard card) according to the present invention, having the front end electrodes 20 and the side electrodes 26, enables the number of front end electrode connections to be increased with no change to the pin diameter and pin interval for a current-standard IC card (current-standard card) 100 shown in FIG. 7. The common socket 10 can accommodate both the current-standard IC card 100 and the new-standard card 14 which is provided with the side electrodes 26 and the first and second concaves 56 and 60 on the sides thereof. When the current-standard card 100 is inserted or removed, the first and second convexes 66 and 70 of the movable plates 36 are pushed by the sides 102 of the current-standard card 100 to place the movable plates 36 in the outermost position thereof in the direction of IC card insertion passage width. As is the case with the insertion or removal of the new-standard card 14, when the current-standard card 100 is inserted or removed, the mating side electrodes 42 of the socket 10 do not come into contact with the current-standard card 100. Since the current-standard card 100 has on the sides 102 thereof no equivalent to the first and second concaves 56 and 60, the movable plates 36 are kept in the outermost position thereof in the direction of IC card insertion passage width when the front end electrodes 20 come into contact with the mating front end electrodes 32, so that the insertion of the current-standard card 100 is completed.

Indeed the IC card 14 in the above-described embodiment has the front end electrodes 20 and the side electrodes 26, but the IC card 14 is not necessarily required to include the front end electrodes 20, and the socket 10 can receive both a new-standard IC card with at least side electrodes 26 and a current-standard IC card 100 with front end electrodes only (providing a current-standard IC card with not only front end electrodes but also side electrodes allows the number of connections with a socket to be increased), and moreover, the arrangement of the present invention allows socket space to be more reduced than a conventional arrangement requiring different sockets, depending on whether a current-standard IC card or an IC card having an increased number of connections with a socket is used. When the IC card is inserted or removed, the side electrodes 26 and the mating side electrodes 42 of the socket 10 are prevented from being rubbed against each other (or the mating side electrodes 42 of the socket 10 are prevented from being rubbed against the current-standard IC card 100) to avoid mechanical damage due to rubbing. This rubbing prevention is performed by a simple structure including the concaves 56 and 60 on the sides 24 of the IC card 14 and the convexes 66 and 70 of the movable plates 36 without any specific operation other than the insertion and removal of the IC cards 14 and 100.

An IC card which performs real-time processing of data stored in frame memory is also feasible.

The movable plates 36 are provided on both side of the IC card insertion passage, but a movable plate and a fixed plate may be installed on one side and on the other, respectively. The side electrodes 26 are provided on both sides of the IC card 14, but the side electrodes may be installed on one side only, and accordingly, the mating side electrodes 42 may be installed on one side only.

An arrangement of connections between an IC card and a socket, the arrangement according to the present invention, can cover both a current-standard IC card with front end electrodes only and a new-standard IC card with at least side electrodes, using a common socket, connections of which new-standard IC card with a socket can be increased in numbers, and moreover, the arrangement allows socket space to be more reduced than a conventional arrangement requiring different sockets, depending on whether a current-standard IC card or an IC card having an increased number of connections with a socket is used. In addition, when the new-standard IC card is inserted or removed, the side electrodes 26 and the mating side electrodes 42 are prevented from being rubbed against each other (or the mating side electrodes 42 of the socket are prevented from being rubbed against the current-standard IC card) to avoid mechanical damage due to rubbing. This rubbing prevention is performed by a simple structure including the concaves on the sides of the IC card and the convexes of the movable plates without any specific operation other than the insertion and removal of the IC card.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed:

1. An arrangement of connections in an IC socket into which an IC card is inserted, one end first, wherein said 10 card includes front end electrodes at the insertion end thereof and side electrodes on the sides thereof parallel to the direction of IC card insertion, said socket comprising:

mating front end electrodes provided at the farthest end of an IC card insertion passage, which mating front end electrodes correspond to said front end electrodes, movable members provided in parallel with the sides of said IC card insertion passage, which movable members can move in the direction of IC card insertion passage width, mating side electrodes provided for said movable members so as to move together with said movable members, which mating side electrodes correspond to said side electrodes, pushing means pushing said movable members toward said IC card insertion passage in the direction of IC card insertion passage width; and convexes provided for said movable members, which convexes, when said IC card is inserted or removed, are pushed by the sides of said IC card, so that said movable members are placed in the outermost position thereof in the direction of IC card insertion passage width, thereby separating said side electrodes from said socket and said mating side electrodes from said IC card including said side electrodes;

wherein said convexes mate with concaves provided on the sides of said IC card, which convex fit into said concaves at the position where said front end electrodes fit into said mating front end electrodes and thus allowing said movable members to return to the original position thereof to bring said side electrodes into contact with said mating side electrodes.

2. An assembly, comprising:

an arrangement of connections between an IC card and a socket into which said IC card is inserted, one end first, wherein said IC card includes at least side electrodes on the sides parallel to the direction of IC card insertion or both said side electrodes and front end electrodes at the insertion end thereof, said socket includes mating front end electrodes provided at the farthest end of an IC card insertion passage, which mating front end electrodes correspond to said front end electrodes, movable members provided in parallel with the sides of said IC card insertion passage, which movable members can move in the direction of IC card insertion passage width, mating side electrodes provided for said movable members so as to move together with said movable members, which mating side electrodes correspond to said side electrodes, and pushing means pushing said movable members toward said IC card insertion passage in the direction of IC card insertion passage width, convexes provided for said movable members, which convexes, when said IC card is inserted or removed, are pushed by the sides of said IC card, so that the movable members are placed in the outermost position thereof in the direction of IC card insertion passage width, thereby separating said side electrodes from said socket and said mating side electrodes from said IC card including said side electrodes; and concaves provided on the sides of said IC card, which concaves, when the insertion of said IC card is completed, fit over said convexes, allowing said movable members to return to the original position thereof to bring said side electrodes into contact with said mating side electrodes.

3. An IC card insertion socket, comprising;

an IC card insertion passage into which an IC card including at least side electrodes on the sides thereof or both said side electrodes and front end electrodes at one end is inserted, said one end first, mating end electrodes provided at the farthest end of an IC card insertion passage, which mating front end electrodes correspond to said front end electrodes, movable members provided in parallel with the sides of said IC card insertion passage, which movable members can move in the direction of IC card insertion passage width, mating side electrodes provided for said movable members so as to move together with said movable members, which mating side electrodes correspond to said side electrodes, pushing means pushing said movable members toward said IC card insertion passage in the direction of IC card insertion passage width, and convexes provided for said movable members, which convexes, when said IC card is inserted or removed, are pushed by the sides of said IC card, so that said movable members are placed in the outermost position thereof in the direction of IC card insertion passage width, thereby separating said side electrodes from said socket and said mating side electrodes from said IC card, said convexes, when the insertion of said IC card is completed, fitting into concaves provided on the sides of said IC card and thus allowing said movable members to return to the original position thereof to bring said side electrodes into contact with said mating side electrodes.

* * * * *